United States Patent
Tamida et al.

(10) Patent No.: US 11,020,823 B2
(45) Date of Patent: Jun. 1, 2021

(54) LASER DIODE DRIVING POWER SOURCE AND LASER MACHINING DEVICE

(71) Applicant: Mitsubishi Electric Corporation, Tokyo (JP)

(72) Inventors: Taichiro Tamida, Tokyo (JP); Shingo Tsuda, Tokyo (JP); Teruaki Fukuoka, Tokyo (JP); Hiroshi Ikarashi, Tokyo (JP); Akihiko Iwata, Tokyo (JP); Takeshi Morimoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 126 days.

(21) Appl. No.: 16/464,273

(22) PCT Filed: Feb. 14, 2017

(86) PCT No.: PCT/JP2017/005306
§ 371 (c)(1),
(2) Date: May 27, 2019

(87) PCT Pub. No.: WO2018/150459
PCT Pub. Date: Aug. 23, 2018

(65) Prior Publication Data
US 2020/0290155 A1     Sep. 17, 2020

(51) Int. Cl.
*B23K 26/352* (2014.01)
*H01S 5/062* (2006.01)
*H01S 5/068* (2006.01)

(52) U.S. Cl.
CPC .......... *B23K 26/3576* (2018.08); *H01S 5/062* (2013.01); *H01S 5/06808* (2013.01)

(58) Field of Classification Search
CPC ... B23K 26/3576; B41M 7/0009; B41J 2/475; H01S 5/06808
(Continued)

(56) References Cited

U.S. PATENT DOCUMENTS

| | | | | |
|---|---|---|---|---|
| 5,895,588 A | * | 4/1999 | Matsumura | G06K 1/126 |
| | | | | 219/121.68 |
| 6,023,040 A | * | 2/2000 | Zahavi | B23K 26/361 |
| | | | | 219/121.69 |

(Continued)

FOREIGN PATENT DOCUMENTS

| | | |
|---|---|---|
| JP | 1-254393 A | 10/1989 |
| JP | 2000-349375 A | 12/2000 |

(Continued)

OTHER PUBLICATIONS

International Search Report dated Mar. 28, 2017 for PCT/JP2017/005306 filed on Feb. 14, 2017, 11 pages including English Translation of the International Search Report.

(Continued)

*Primary Examiner* — Tuan N Nguyen
(74) *Attorney, Agent, or Firm* — Xsensus LLP

(57) ABSTRACT

A laser diode driving power source of a laser machining device that radiates laser light emitted from an LD to a workpiece to machine the workpiece includes a power converter including a switching device, to supply a current to the LD, and a control unit to control a switching operation of the switching device. A value smaller than a value that is n times a time constant for laser machining is set as a switching period of the switching device in the control unit, the n is larger than 1, and the time constant for laser machining is a value obtained by dividing a surface roughness required for machining of the workpiece by a moving velocity of the workpiece.

9 Claims, 8 Drawing Sheets

(58) Field of Classification Search
USPC .................................................. 219/121.61
See application file for complete search history.

(56) References Cited

U.S. PATENT DOCUMENTS

| | | | |
|---|---|---|---|
| 6,259,714 B1* | 7/2001 | Kinbara | .................. H01S 5/042 |
| | | | 372/38.02 |
| 2008/0000887 A1* | 1/2008 | Sheth | .................. B23K 26/361 |
| | | | 219/121.69 |
| 2016/0285389 A1* | 9/2016 | Sakai | .................... H01S 3/1305 |
| 2017/0001459 A1* | 1/2017 | Uehira | ..................... B41J 2/475 |
| 2018/0290476 A1 | 10/2018 | Uehira et al. | |

FOREIGN PATENT DOCUMENTS

| JP | 3456120 B2 | 8/2003 |
|---|---|---|
| JP | 2005-209759 A | 8/2005 |
| JP | 2005-305552 A | 11/2005 |
| JP | 2013-233556 A | 11/2013 |
| JP | 2016-181544 A | 10/2016 |
| JP | 2017-13121 A | 1/2017 |

OTHER PUBLICATIONS

Notice of Reasons for Refusal received for Japanese Patent Application No. 2017-536982, dated Aug. 4, 2017, 6 pages including English Translation.
Decision to Grant a Patent received for Japanese Patent Application No. 2017-536982, dated Dec. 1, 2017, 5 pages including English Translation.
Office Action issued in Chinese Application 201780080175.X dated Nov. 25, 2019.
Office Action dated Mar. 12, 2020 in German Patent Application No. 11 2017 005 856.2, 12 pages.

* cited by examiner

LASER DIODE DRIVING POWER SOURCE AND LASER MACHINING DEVICE

CROSS-REFERENCE TO RELATED APPLICATIONS

The present application is based on PCT filing PCT/JP2017/005306, filed Feb. 14, 2017, the entire contents of which are incorporated herein by reference.

FIELD

The present invention relates to a laser diode driving power source of a laser machining device that machines a workpiece, and a laser machining device.

BACKGROUND

A conventional power source for driving a laser diode (LD) outputs a direct-current voltage higher than a voltage required for the LD using a constant voltage source that has a large-capacity capacitor on an output side. This direct-current voltage is applied to the LD and a regulator circuit. The conventional LD-driving power source adjusts the voltage applied to the regulator to thereby adjust an electrical current flowing through the LD. The regulator is constructed of semiconductor elements such as a MOSFET (Metal Oxide Semiconductor Field Effect Transistor) and a transistor. The conventional LD-driving power source can change a current value at a high speed by control of the regulator. However, because a current flowing through the regulator is loss, power efficiency is lowered.

An LD power-source control device employing a constant current system disclosed in Patent Literature 1 includes a power source that supplies power to a laser diode, a current-controlling switching device and a reactor that are inserted between the laser diode and the power source, a current detector, and a diode connected in parallel to a series circuit of the current-controlling switching device and the reactor, but does not include a large-capacity capacitor on an output side of the power source, thereby achieving a constant-current operation.

CITATION LIST

Patent Literature

Patent Literature 1: Japanese Patent No. 3456120

SUMMARY

Technical Problem

In laser machining, a machining head is moved with respect to a workpiece or the workpiece is moved with respect to the machining head, and such movement is a base for machining of the workpiece. In an LD-driving power source employing a constant current system disclosed in Patent Literature 1, when a current value is changed at a high speed by switching control, a current ripple becomes large in association with turning on and off of the switching device and a value of a current flowing through the LD fluctuates, causing fluctuation of an LD output value, that is, a laser intensity. The LD-driving power source disclosed in Patent Literature 1 has a problem that a machined-surface roughness required for machining cannot be achieved because of the fluctuation of the LD output value in some cases.

The present invention has been made in view of the above circumstances, and an object of the present invention is to provide a laser diode driving power source that can reduce fluctuation of an LD output value.

Solution to Problem

In order to solve the problem mentioned above and achieve the object, the present invention provides a laser diode driving power source of a laser machining device that radiates laser light emitted from a laser diode to a workpiece to machine the workpiece, comprising: a power converter including a switching device, to supply a current to the laser diode; and a control unit to control a switching operation of the switching device, wherein a value smaller than a value that is n times a time constant for laser machining is set as a switching period of the switching device in the control unit, the n is larger than 1, and the time constant for laser machining is a value obtained by dividing a surface roughness required for machining of the workpiece by a moving velocity of the workpiece.

Advantageous Effects of Invention

The laser diode driving power source according to the present invention has an advantageous effect that it is possible to reduce fluctuation of an LD output value.

DESCRIPTION OF EMBODIMENTS

A laser diode driving power source and a laser machining device according to an embodiment of the present invention will be described in detail below with reference to the drawings. The present invention is not necessarily limited by the embodiment.

Embodiment

Figure 1:
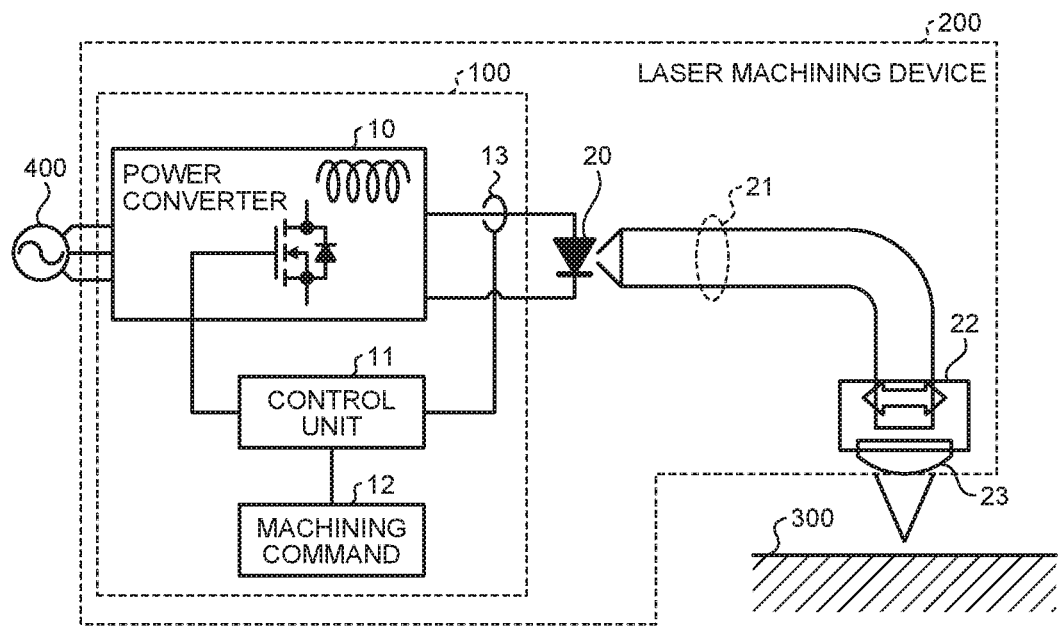
FIG. 1 is a configuration diagram of a laser diode driving power source according to the present embodiment.

FIG. 1 is a configuration diagram of a laser diode driving power source according to the present embodiment. A laser machining device 200 illustrated in FIG. 1 includes a laser diode driving power source 100, an LD 20 that is a laser diode emitting laser light by a current supplied from the laser diode driving power source 100, a machining head 22 for machining a workpiece 300, and a fiber 21 that is an example of an optical coupling system and an optical amplifier, which transmits the laser light emitted from the LD 20 to the machining head 22.

The laser diode driving power source 100 includes a power converter 10 and a control unit 11 that controls turning on and off of a switching device in the power converter 10. The power converter 10 compares a current value detected by a current detector 13 with a current command value to control a switching operation of the switching device provided in the power converter 10. The power converter 10 is a constant-current system power converter that converts alternating-current power supplied from an alternating-current power source 400 to direct-current power by turning on and off the switching device.

The laser light outputted from the LD 20 is transmitted to the machining head 22 through the fiber 21 and is focused onto the workpiece 300 by a lens 23 provided in the machining head 22. In this manner, the workpiece 300 is machined to be cut. In machining of the workpiece 300, it is necessary to move the focusing position of the laser on the workpiece 300. For this reason, the workpiece 300 is placed on a workpiece moving mechanism (not illustrated) for moving the workpiece 300 or a head moving mechanism (not illustrated) for moving the machining head 22 is provided in the laser machining device 200.

Figure 2:
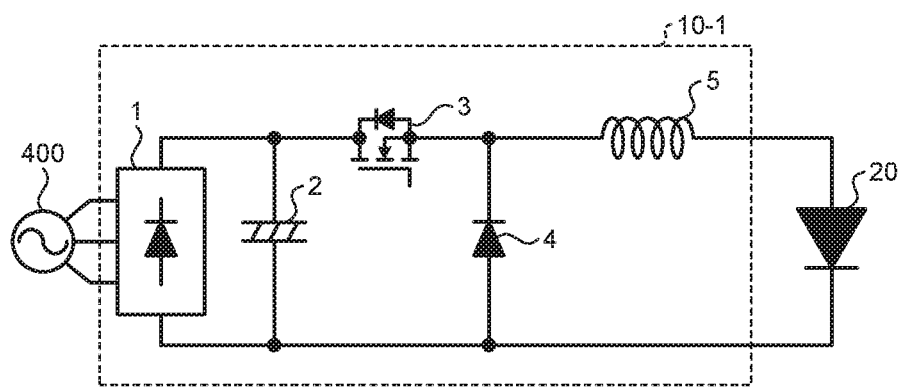
FIG. 2 is a diagram illustrating a first configuration example of a power converter illustrated in FIG. 1.

FIG. 2 is a diagram illustrating a first configuration example of the power converter illustrated in FIG. 1. A power converter 10-1 illustrated in FIG. 2 is a non-insulated type and step-down chopper system power converter. The power converter 10-1 includes a rectifier circuit 1 that rectifies alternating-current power supplied from the alternating-current power source 400, a capacitor 2 connected in parallel to the rectifier circuit 1, a switching device 3, a chopper diode 4, and a reactor 5.

A drain of the switching device 3 is connected to the rectifier circuit 1 and one end of the capacitor 2. A source of the switching device 3 is connected to a cathode of the chopper diode 4 and one end of the reactor 5. An anode of the chopper diode 4 is connected to the other end of the capacitor 2 and a cathode of the LD 20. The other end of the reactor 5 is connected to an anode of the LD 20.

Figure 3:
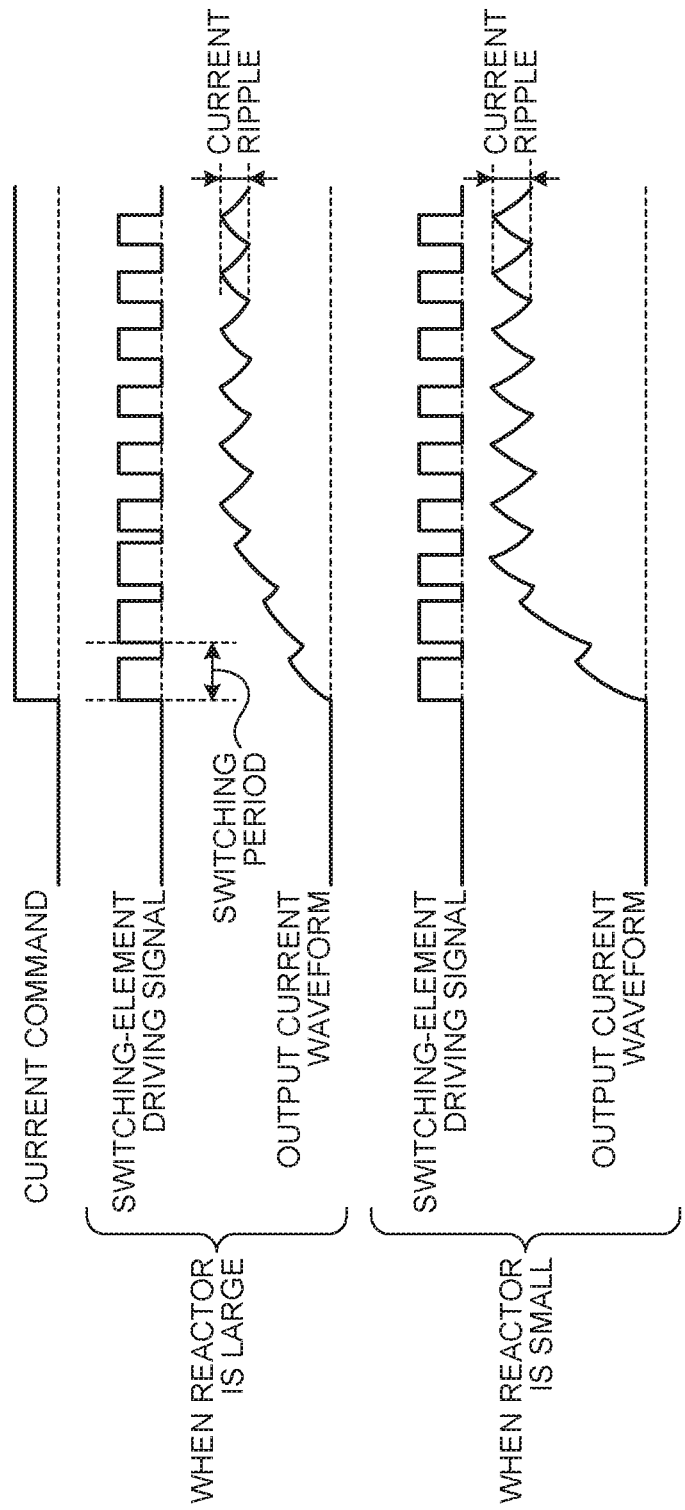
FIG. 3 is an explanatory diagram of an output current waveform in a case of using a power converter illustrated in FIG. 2.

FIG. 3 is a diagram for explaining an output current waveform in a case of using the power converter illustrated in FIG. 2. FIG. 3 illustrates a current command that is a machining command 12, a switching-device driving signal generated in the control unit 11 illustrated in FIG. 1, and an output current waveform of the power converter 10-1. Further, FIG. 3 illustrates a switching-device driving signal and an output current waveform when a reactor is large, and illustrates a switching-device driving signal and an output current waveform when the reactor is small.

When the current command is inputted to the control unit 11 and a current rapidly rises, the switching device 3 starts a switching operation with a specific switching period. Accordingly, the output current waveform rises as illustrated in FIG. 3. The current waveform is caused to fluctuate by turning on and off operations of the switching device. Such fluctuation is called "current ripple". Although it is possible to reduce a fluctuation width of the current ripple if the reactor is high in value, rising of the output current becomes slower. If the reactor is reduced in value, the output current rises more quickly and therefore reaches a target current value in a short time, but the current ripple becomes larger as the reactor becomes smaller.

Figure 4:
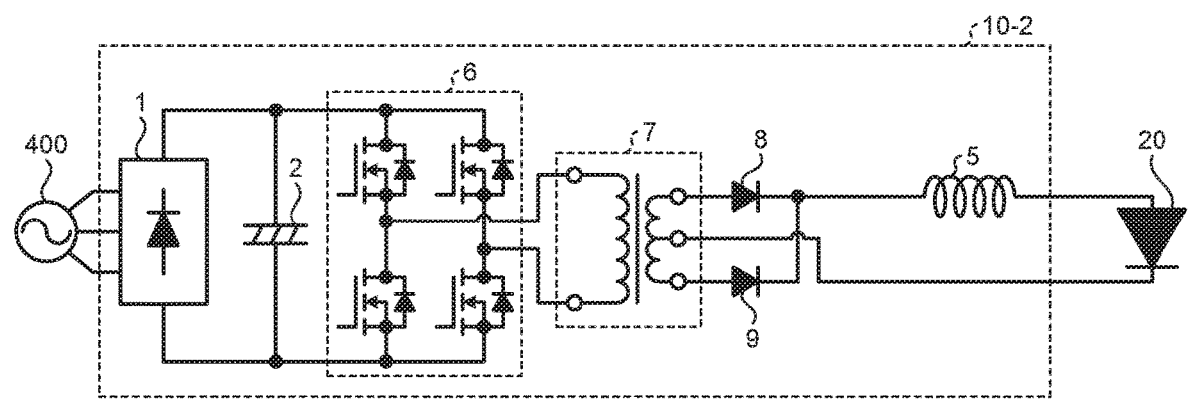
FIG. 4 is a diagram illustrating a second configuration example of the power converter illustrated in FIG. 1.

FIG. 4 is a diagram illustrating a second configuration example of the power converter illustrated in FIG. 1. A power converter 10-2 illustrated in FIG. 4 is an insulated type power converter and is of a system in which power rectified by the rectifier circuit 1 is converted to alternating-current power by an inverter 6 and is then rectified again through a transformer 7. A current outputted to a secondary side of the transformer 7 flows to the LD 20 via a diode 8 or a diode 9 and the reactor 5. An output voltage is adjusted based on a turn ratio of the transformer 7, and an output current is adjusted based on a ratio of an on-duration time to a switching period of a plurality of switching devices in the inverter 6.

Figure 5:
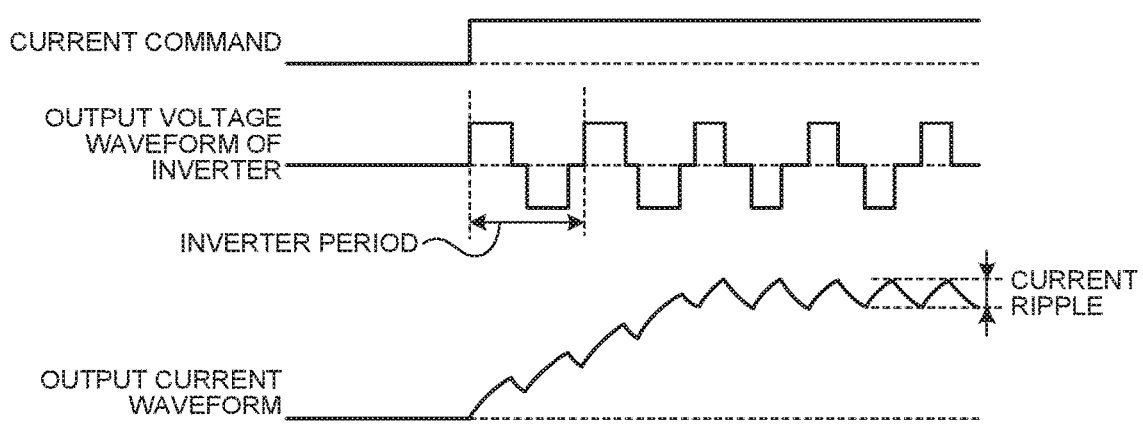
FIG. 5 is an explanatory diagram of an output current waveform in a case of using a power converter illustrated in FIG. 4.

FIG. 5 is a diagram for explaining an output current waveform in a case of using the power converter illustrated in FIG. 4. FIG. 5 illustrates a current command, an output voltage waveform of the inverter 6, and an output current waveform of the power converter 10-2.

Because the inverter 6 has a full-bridge configuration, the output voltage waveform of the inverter 6 is a square wave with positive and negative values as illustrated in FIG. 5. By adjusting the pulse width of this square wave, an output is adjusted. When the output voltage of the inverter 6 becomes asymmetrical for a positive side and a negative side, a direct-current component is temporarily generated in a current flowing through the transformer 7. Generation of the direct-current component causes biased magnetization of a core of the transformer 7, and leads to magnetic saturation if a current value becomes high, so that any accident of short-circuit of a current may occur. Therefore, it is necessary that the output waveform of the transformer 7 is symmetrical for the positive side and the negative side. A switching period of the power converter 10-2 is equal to a time of one set of a positive output and a negative output, that is, an inverter period illustrated in FIG. 5.

A configuration example of a control unit that controls an operation of the switching device 3 is described below.

Figure 6:
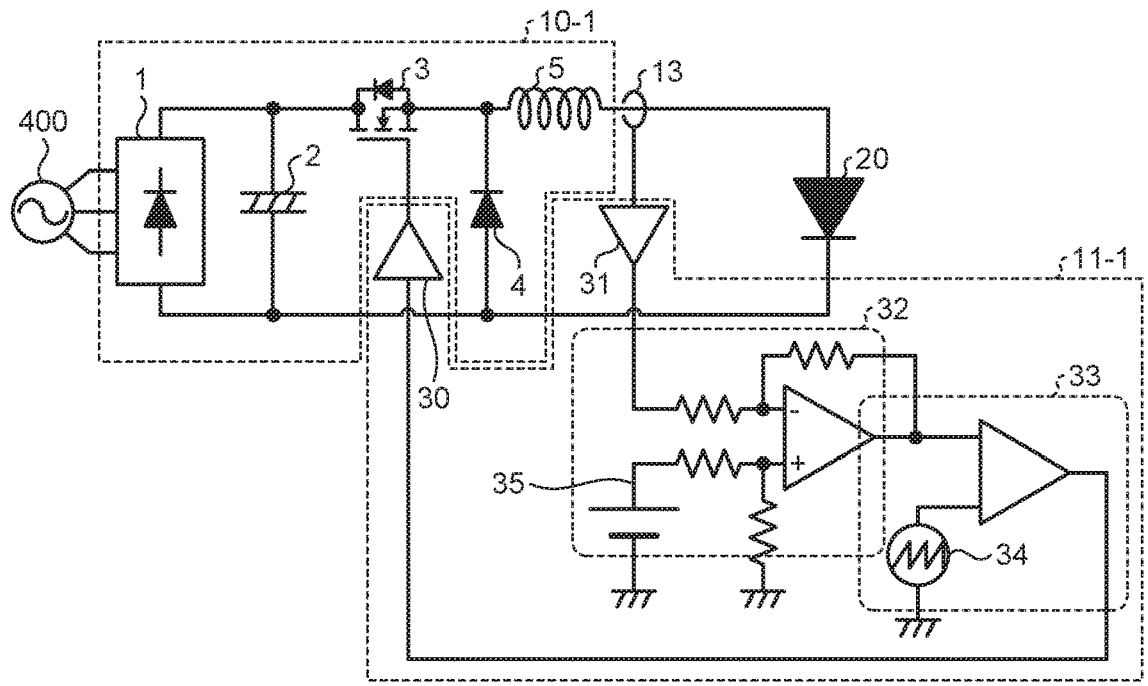
FIG. 6 is a diagram illustrating a first configuration example of a control unit illustrated in FIG. 1.

FIG. 6 is a diagram illustrating a first configuration example of the control unit illustrated in FIG. 1. A control unit 11-1 illustrated in FIG. 6 is an example of a control circuit that drives the non-insulated type step-down chopper system power converter 10-1 in PWM (Pulse Width Modulation) with a determined frequency.

The control unit 11-1 includes an amplifier 31 that amplifies a current detected by the current detector 13, an error amplifying circuit 32 that compares the current amplified by the amplifier 31 with a current command value 35 to get an error and amplifies and outputs a signal corresponding to the error, a triangle-wave generator 34, a PWM generating circuit 33, and a driving circuit 30.

The PWM generating circuit 33 compares a triangle wave outputted from the triangle-wave generator 34 and a signal outputted from the error amplifying circuit 32 with each other to output a PWM signal having a pulse width according to the output signal of the error amplifying circuit 32. The driving circuit 30 converts the PWM signal outputted from the PWM generating circuit 33 to a driving signal for the switching device 3.

The current detected by the current detector 13 is compared with the current command value 35 by the error amplifying circuit 32 to obtain an error, and a signal corresponding to the error is inputted to the PWM generating circuit 33. In the PWM generating circuit 33, the triangle wave and the output value of the error amplifying circuit 32 are compared with each other, and thereby the PWM signal having a pulse width corresponding to the output signal of the error amplifying circuit 32 is outputted. The PWM signal is amplified and converted to the driving signal in the driving circuit 30. The switching device 3 is driven by the driving signal. In the circuit having this configuration, the frequency of the triangle-wave generator 34 is equal to a switching frequency of the switching device 3.

Figure 7:
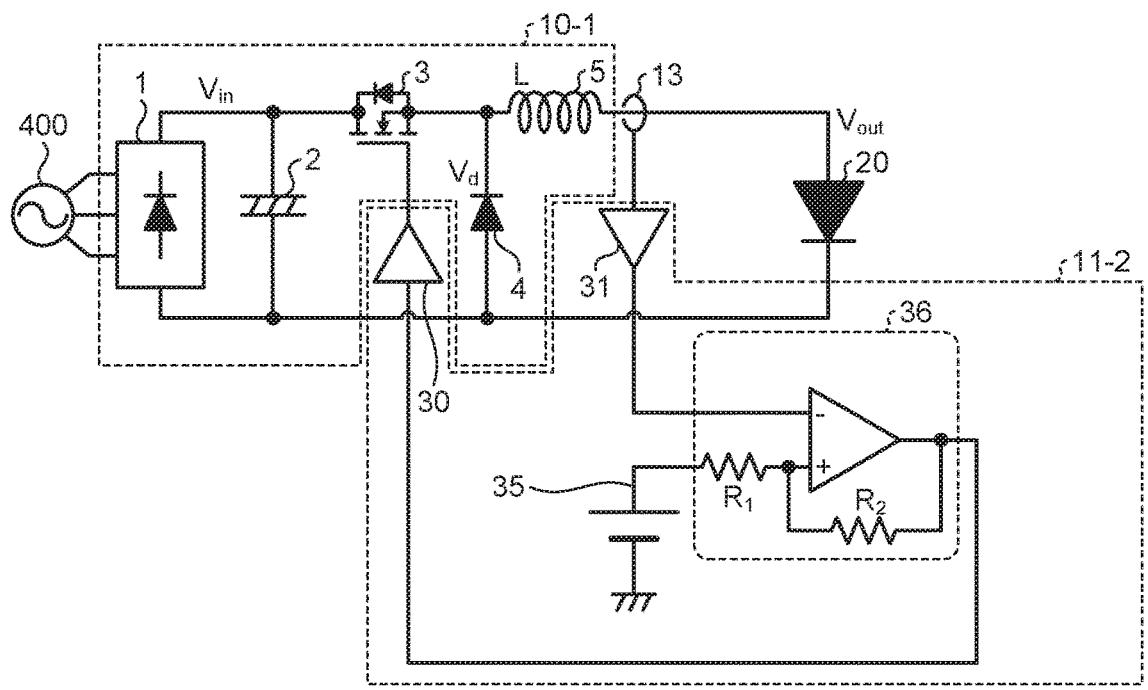
FIG. 7 is a diagram illustrating a second configuration example of the control unit illustrated in FIG. 1.

FIG. 7 is a diagram illustrating a second configuration example of the control unit illustrated in FIG. 1. A control unit 11-2 illustrated in FIG. 7 is an example of a control circuit having no reference-frequency circuit for driving for the control unit 11-2, which is not of constant-frequency driving based on a triangle wave. Even in a circuit with a variable frequency as in the control unit 11-2, it is possible to define a switching frequency of the switching device 3.

The control unit 11-2 includes the driving circuit 30, the amplifier 31, and a comparator 36. In the control unit 11-2, a current detected by the current detector 13 is compared with the current command value 35 by the comparator 36. The control unit 11-2 executes control in such a manner that the switching device 3 is turned off when the current detected by the current detector 13 is larger than the current command value 35, but is turned on when the current detected by the current detector 13 is smaller than the current command value 35.

Two resistors $R_1$ and $R_2$ are connected to the comparator 36, and some hysteresis occurs in an input and an output of the comparator 36. Assuming that a current command value is I and a current fluctuation width by the comparator 36 with a hysteresis is dI, a relation of the following expression (1) is established between the current command value I and the current fluctuation width dI.

[Formula 1]

$$dI = \frac{R_1}{R_1 + R_2} I \quad (1)$$

Assuming that an inductance of the reactor 5 is L, an input voltage of the power converter 10-1 is $V_{in}$, an output voltage of the power converter 10-1, that is, a forward voltage of the LD 20 is $V_{out}$, and a forward voltage of the chopper diode 4 is $V_d$, the current fluctuation width dI of an output current when the switching device 3 is on is represented by the following expression (2). Further, the current fluctuation width dI of the output current when the switching device 3 is off is represented by the following expression (3).

[Formula 2]

$$V_{in} - V_{out} = L \frac{dI}{dt_{on}} \quad (2)$$

[Formula 3]

$$V_{out} - V_d = L \frac{dI}{dt_{off}} \quad (3)$$

Figure 8:
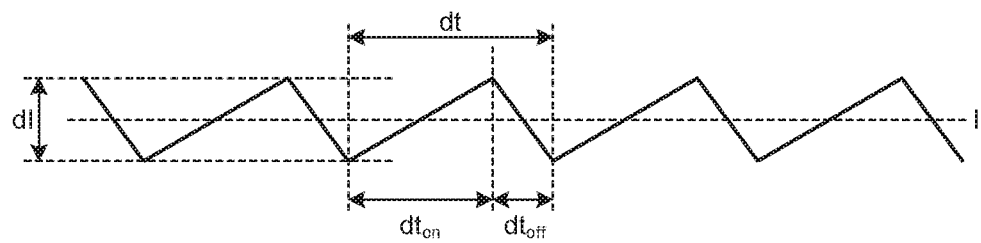
FIG. 8 is a chart illustrating a relation among a switching period, fluctuation of an output current, an on-duration of a switching device, and an off-duration of the switching device.

FIG. 8 is a chart illustrating a relation among a switching period, fluctuation of an output current, an on-duration time of a switching device, and an off-duration time of a switching device. $dt_{on}$ in the above expression (2) is an on-duration time of the switching device 3. $dt_{off}$ in the above expression (3) is an off-duration time of the switching device 3. A switching period dt is obtained by $dt=dt_{on}+dt_{off}$. The above expressions (2) and (3) assume a state where a current steadily flows with stability and ignore resistance loss of a circuit. From the above expressions (2) and (3), the switching period dt is represented by the following expression (4).

[Formula 4]

$$dt = L \cdot dI \cdot \left( \frac{1}{V_{in} - V_{out}} + \frac{1}{V_{out} - V_d} \right) \quad (4)$$
$$= L \cdot \left( \frac{1}{V_{in} - V_{out}} + \frac{1}{V_{out} - V_d} \right) \frac{R_1}{R_1 + R_2} I$$

Figure 9:
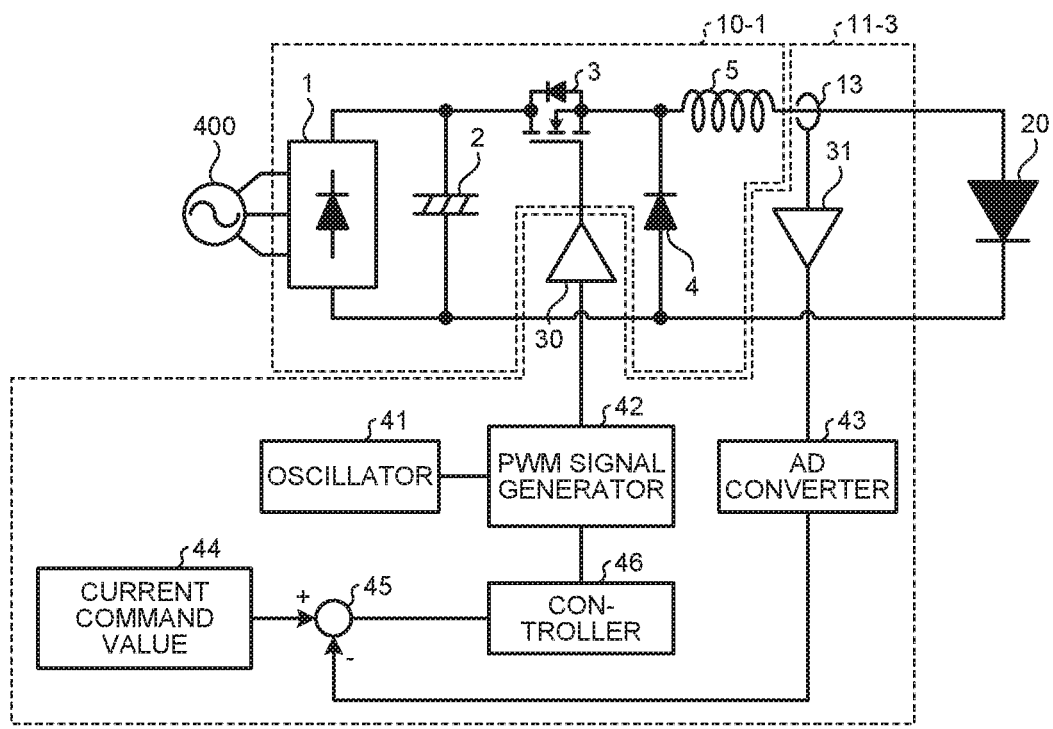
FIG. 9 is a diagram illustrating a third configuration example of the control unit illustrated in FIG. 1.

FIG. 9 is a diagram illustrating a third configuration example of the control unit illustrated in FIG. 1. A control unit 11-3 illustrated in FIG. 9 is configured by a circuit such as a microcomputer or an FPGA (Field Programmable Gate Array). A current detected by the current detector 13 is converted to a digital signal by an AD (Analog to Digital) converter 43. A difference between a value obtained by the conversion and a current command value 44 is obtained by a subtractor 45. In accordance with this difference, a control signal for the switching device 3 is generated in a controller 46.

This control signal is converted to a PWM signal by a PWM signal generator 42 on the basis of a constant-frequency signal that is generally outputted from an oscillator 41, and the PWM signal inputted to the driving circuit 30 for the switching device 3. It is optional whether this circuit configuration is partly configured as a digital circuit or is entirely realized inside the FPGA.

In such a circuit, a period of the signal output from the oscillator 41 has the same meaning as a switching frequency of the switching device 3. The signal outputted from the oscillator 41 is generally generated inside a digital circuit. However, because the switching device 3 can be driven in PWM by this signal as a result, it is possible to identify a time constant for the laser machining if the frequency of this signal is measured. The time constant for the laser machining is a value obtained by dividing a surface roughness required for machining the workpiece 300 by a moving velocity of the workpiece 300. Details of the time constant for the laser machining will be described later.

Next, influences of the current fluctuation width dI of an output current of the power converter 10-1 on machining of the workpiece 300 are described.

Figure 10:
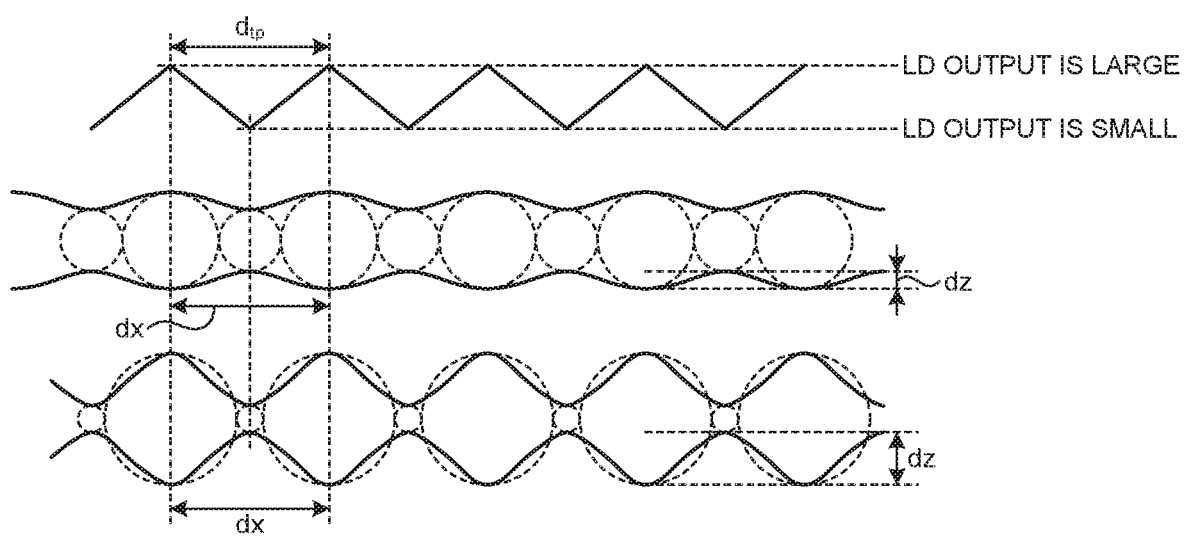
FIG. 10 is an explanatory diagram of influences of fluctuation of an output current of a power converter on machining of a workpiece.

FIG. 10 is an explanatory diagram of influences of fluctuation of an output current of a power converter on machining of a workpiece. FIG. 10 illustrates, from a top to a bottom thereof, fluctuation of an output current of the power converter 10-1, an uneven surface when a machined-surface roughness is small, and an uneven surface when the machined-surface roughness is large.

In laser machining, the machining head 22 is moved with respect to the workpiece 300 keeping a stationary condition to cut the workpiece 300, or the workpiece 300 is moved with respect to the machining head 22 keeping a stationary condition to cut the workpiece 300. At that time, fluctuation of a value of a current flowing through the LD 20 causes fluctuation of an LD output value, that is, a laser intensity. Therefore, the fluctuation of the output current illustrated in the top in FIG. 10 can be regarded as being equal to fluctuation of the laser intensity of the LD 20. A period of the fluctuation of the laser intensity is $dt_p$, which corresponds to a switching period. This period $dt_p$ may be sometimes referred to as "switching time constant" or "switching period".

The second and third rows from the top of FIG. 10 shows a situation where a machined groove becomes broader or narrower for reason of the fluctuation of the laser intensity when the workpiece 300 and the machining head 22 are relatively moved. Adjacent large and small circles are in contact with each other. This is because a beam shape of the laser at a focal point of the lens 23 can be regarded as being circular and the width of circular laser light radiated onto the workpiece 300 fluctuates with time.

Assuming that a period of the fluctuation of the laser intensity is dx, a relation between the period dx and the period $dt_p$ depends on a moving velocity $v_L$ of the relative movement of the workpiece 300 and the machining head 22, as represented by the following expression (5).

[Formula 5]

$$dx = v_L \times dt_p \qquad (5)$$

The period dx is not a so-called surface roughness, but is like a "surge" appearing in a machined surface. Meanwhile, in machining, "surface roughness" of machining is important as the finishing accuracy of a machined surface in many cases. There are various definitions for a surface roughness. A surface roughness dz can be defined as a width from a bottom of a concave portion to a top of a convex portion in a direction perpendicular to a laser-emitting direction in a top surface of the workpiece 300, that is, a surface of the workpiece 300 opposed to the machining head 22. The surface roughness dz corresponds to a difference between the smallest beam shape of the laser light and the largest beam shape of the laser light in the focal point, as illustrated in FIG. 10.

Because the period dx and the surface roughness dz are influenced by both fluctuation of the laser and a machining phenomenon during laser machining, a relation between the period dx and the surface roughness dz cannot be represented simply. However, in a case where the surface roughness dz becomes large as illustrated in the third row from the top of FIG. 10, there is a relation represented by the following expression (6) between the surface roughness dz and the period dx.

[Formula 6]

$$dz \leq \frac{dx}{2} \qquad (6)$$

Here, when a surface roughness of $dz_0$ is required as a surface roughness included in some machining performances, it is necessary to make the surface roughness dz of a surface after being laser-machined smaller than the required surface roughness $dz_0$. Accordingly, because the surface roughness dz can be dx/2 at the maximum, it is necessary that the period dx satisfies the following expression (7).

[Formula 7]

$$dx \leq 2 \times dz_0 \qquad (7)$$

From the relation between the period dx and the period $dt_p$ represented by the above expression (5), the above expression (7) can be represented by the following expression (8).

[Formula 8]

$$v_L \times dt_p = dx \leq 2 \times dz_0 \qquad (8)$$

Here, a time constant $dt_m$ of laser machining is defined by the following expression (9). The moving velocity $v_L$ is the maximum moving velocity of a moving mechanism during machining. According to the expression (9), the time constant $dt_m$ of the laser machining can be understood as being obtained by dividing "surface roughness" that is to be a target length as some machining phenomenon by a machining velocity.

[Formula 9]

$$dt_m = \frac{dz_0}{v_L} \qquad (9)$$

The time constant $dt_m$ of laser machining defined in this manner and the switching period $dt_p$ have a relation represented by the following expression (10).

[Formula 10]

$$dt_m = \frac{dz_0}{v_L} \geq \frac{dt_p}{2} \qquad (10)$$

The relation of the above expression (10) means the following matters. In a case of relatively moving the workpiece 300 and laser light with respect to each other to perform laser machining, it is necessary to make the switching period $dt_p$ of the laser diode driving power source 100 smaller than a value that is twice the time constant $dt_m$ for the laser machining, that is, a value obtained by dividing the required surface roughness $dz_0$ by the moving velocity $v_L$ and doubling a result of the division in order to achieve the required surface roughness.

It has been already described that the switching period dt influences the machining quality. In addition, a time constant other than the time constant $dt_m$ for the laser machining may influence the machining in some cases. In a case where feedback control is performed using a detected current value, since the laser diode driving power source 100 controls an output current, it is necessary to consider not only the switching period dt but also a feedback time from detection of the current value until the current value is reflected in a switching operation, that is, a time required for processing in a feedback control system included in the power converter 10. Therefore, when an integration process is performed with a sufficiently long time constant in a control system, it is necessary to use a value obtained by adding a response time constant of the control system to the switching period dt as the time constant $dt_m$ of laser machining. That is, the time constant $dt_m$ for laser machining includes the response time constant of the feedback control system. In a control unit according to the present embodiment, when a current flowing through a laser diode is detected and feedback control is executed, a value smaller than a value obtained by doubling a time constant for laser machining is set as a sum of a response time constant of a feedback control system owned by a laser diode driving power source and a switching period.

The laser diode driving power source 100 according to the present embodiment can reduce influences of fluctuation of a current on a machined-surface roughness by making a time amount obtained by summing a feedback time and a switching period smaller than a value that is twice the time constant $dt_m$ for the laser machining.

In the case of feedback control, it may be necessary to consider a delay caused by a time constant of a feedback system, and a time corresponding to several switching periods may be sometimes required until a current value becomes stable depending upon a control system, so that there is a disadvantage in respect of controlling the current value at a high speed in many cases. On the other hand, in the case of feedforward control, that is, in a case of performing switching with a switching width that is predetermined with respect to a target current value, or performing switching in a predetermined switching pattern, it is not necessary to perform feedback, so that the influences of fluctuation of a current on the machined-surface roughness can be further reduced.

A configuration example of a laser diode driving power source using a power converter of a constant current system has been described above. However, the laser diode driving power source according to the present embodiment may use a power converter of a constant voltage system. The following is description for a configuration example of a laser diode driving power source using a power converter of a constant voltage system.

Figure 11:
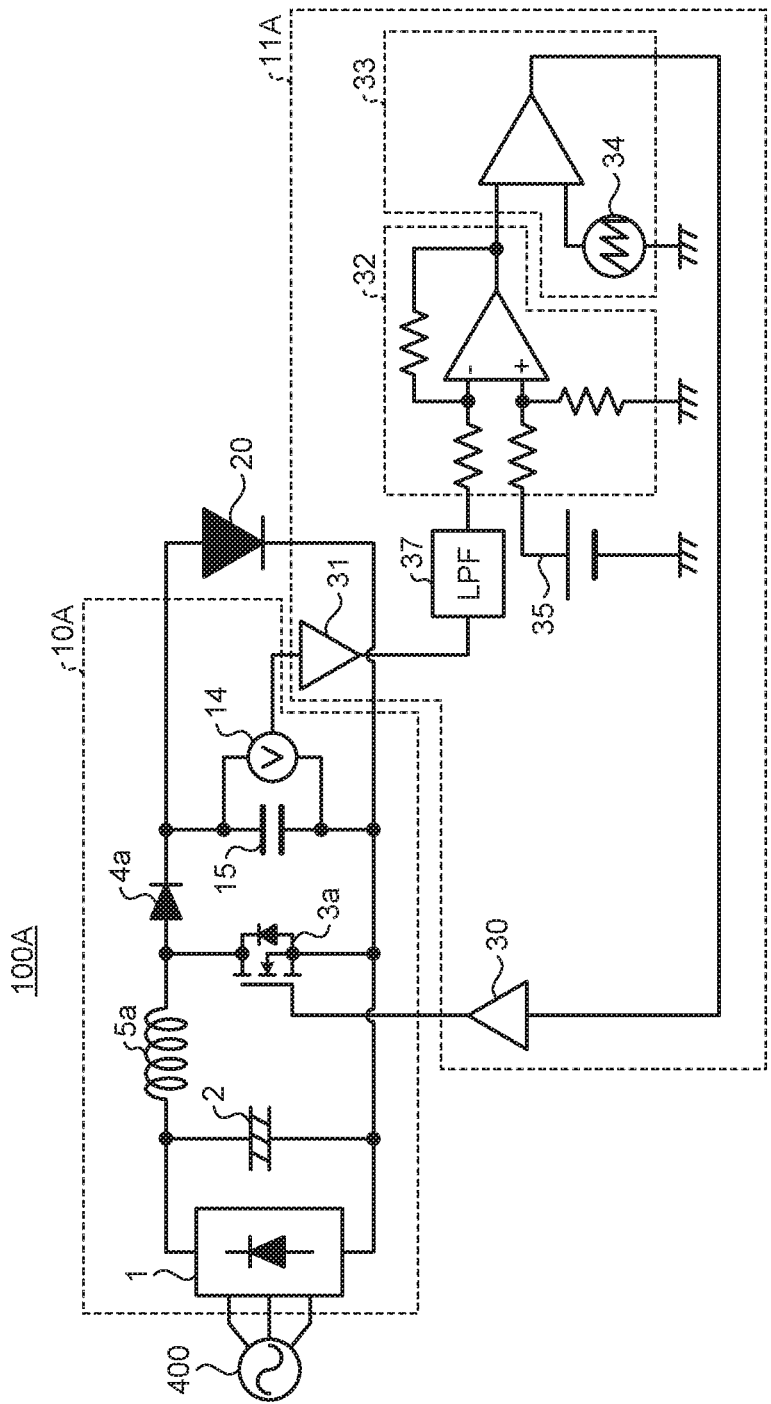
FIG. 11 is a diagram illustrating a modification of the laser diode driving power source according to the present embodiment.

FIG. 11 is a diagram illustrating a modification of the laser diode driving power source according to the present embodiment. A laser diode driving power source 100A illustrated in FIG. 11 is a boost chopper type switching power source of a constant voltage system. The laser diode driving power source 100A includes a power converter 10A and a control unit 11A. In the control unit 11A, a value smaller than a value that is twice a time constant for laser machining is set as a switching period of a switching device, as with the control unit 11 illustrated in FIG. 1.

The power converter 10A includes the rectifier circuit 1, the capacitor 2, a reactor 5a, a switching device 3a, a diode 4a, a capacitor 15, and a voltage detector 14. The control unit 11A includes an LPF (Low Pass Filter) 37 in addition to the constituent elements of the control unit 11-1 illustrated in FIG. 6.

The voltage detector 14 detects an inter-end voltage of the capacitor 15. The detected voltage is used for feedback control in the control unit 11A. In a case where the capacitance of the capacitor 15 is set to a sufficiently large value, an output voltage is kept constant and no voltage ripple is generated. Therefore, it is assumed that the capacitance of the capacitor 15 is set to have a relatively small value. That is, it is assumed that the capacitor 15 does not have sufficient capacitance with respect to an output voltage of the power converter 10A. Further, although the control unit 11A executes feedback control on the output voltage of the power converter 10A, the voltage fluctuates and therefore the LPF 37 is provided between the amplifier 31 and the error amplifying circuit 32.

Figure 12:
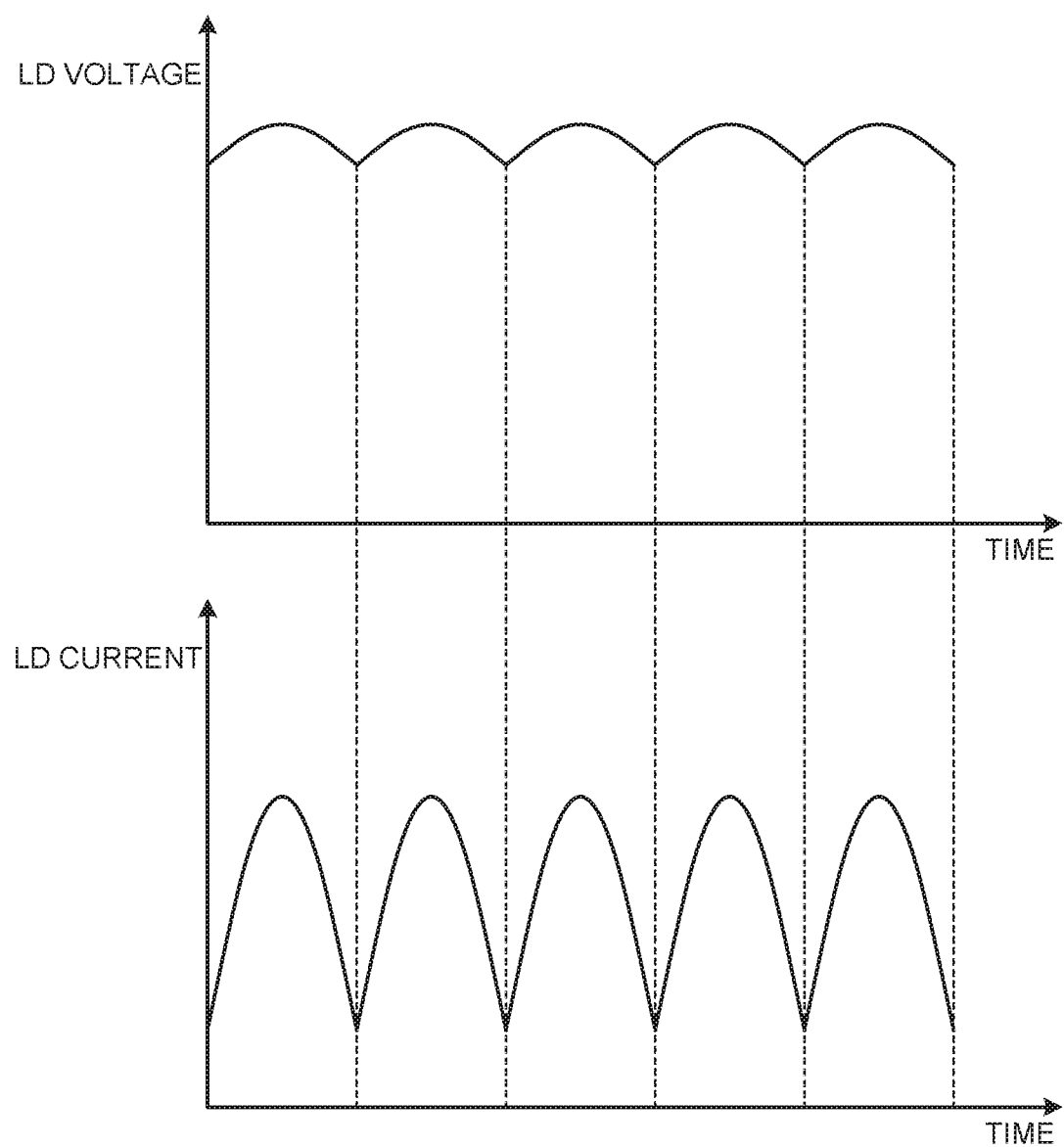
FIG. 12 is a diagram illustrating current and voltage waveforms of an LD illustrated in FIG. 11.

FIG. 12 is a diagram illustrating current and voltage waveforms of the LD illustrated in FIG. 11. As illustrated in FIG. 12, in the current and voltage waveforms of the LD 20, an LD current is largely changed even when an LD voltage is slightly changed because of the current-voltage characteristics of the LD 20. That is, this situation means that slight fluctuation occurs in the LD voltage because of insufficient capacitance of the capacitor 15 though the LD voltage is controlled to be constant by the laser diode driving power source 100A. Therefore, because of the current-voltage characteristics of the LD 20, the LD current largely fluctuates and a current ripple is generated therein, so that the current ripple reaches a level at which the current ripple causes influences on the machining. To reduce the influences on machining, it is necessary that a switching frequency of the laser diode driving power source 100A is sufficiently high.

Although a switching period of a switching device is set to a value smaller than a value that is twice a time constant of laser machining in the present embodiment, the switching period of the switching device is not limited thereto, but may be set to have any value smaller than a value that is n times the time constant of laser machining, where n is a value larger than 1. As described above, as long as the switching period of the switching device is set to a value smaller than a value that is n times the time constant of laser machining, influences of fluctuation of a current on a machined-surface roughness can be reduced.

The laser machining device 200 according to the present embodiment may be provided with an input screen on which items for allowing input of the surface roughness dz and the moving velocity $v_L$ are displayed. By providing this input screen, it is possible to input any values for the surface roughness dz and the moving velocity $v_L$, and further even in a case where the surface roughness dz and the moving velocity $v_L$ are changed, the influences of fluctuation of a current on the machined-surface roughness can be suppressed.

The configurations described in the above embodiment are only examples of the content of the present invention. The configurations can be combined with other publicly known techniques and partially omitted and/or modified without departing from the scope of the present invention.

REFERENCE SIGNS LIST 1 rectifier circuit, 2 capacitor, 3, 3a switching device, 4 chopper diode, 4a diode, 5, 5a reactor, 6 inverter, 7 transformer, 10, 10-1, 10-2, 10A power converter, 11, 11-1, 11-2, 11-3, 11A control unit, machining command, 13 current detector, 14 voltage detector, 15 capacitor, 20 LD, 21 fiber, 22 machining head, 23 lens, 30 riving circuit, 31 amplifier, 32 error amplifying circuit, 33 PWM generating circuit, 34 triangle-wave generator, 35 current command value, 36 comparator, 37 LPF, 41 oscillator, 42 PWM signal generator, 43 AD converter, 44 current command value, 46 controller, 100, 100A laser diode driving power source, 200 laser machining device, 300 workpiece, 400 alternating-current power source, $R_1$, $R_2$ resistor.

The invention claimed is:

1. A laser diode driving power source of a laser machining device that radiates laser light emitted from a laser diode to a workpiece to machine the workpiece, comprising:
    a power converter including a switching device, to supply a current to the laser diode; and
    a control circuit configured to control a switching operation of the switching device, the control circuit being configured to set a switching period of the switching device in the
    control circuit to a value that is smaller than twice a time constant for laser machining,
    wherein the time constant for laser machining is a value obtained by dividing a surface roughness required to be produced by the laser machining of the workpiece by a moving velocity of the workpiece, and the control circuit is further configured to control the switching operation of the switching device with a switching width that is predetermined with respect to a target current value or in a predetermined switching pattern when a current flowing through the laser diode is detected and feedforward control is performed;

wherein the surface roughness required to be produced by the laser machining of the workpiece is defined as a width from a bottom to a top of a concave portion of a cut produced by the laser machining of the workpiece.

2. A laser machining device comprising the laser diode driving power source according to claim 1.

3. The laser machining device according to claim 2, comprising an input screen on which items for allowing inputs of the surface roughness and the moving velocity are displayed.

4. A laser diode driving power source of a laser machining device that radiates laser light emitted from a laser diode to a workpiece to machine the workpiece, comprising:

a power converter including a switching device, to supply a current to the laser diode; and a control circuit configured to control a switching operation of the switching device, the control circuit being configured to set a switching period of the switching device in the control circuit to a value that is smaller than twice a time constant for laser machining, wherein the time constant for laser machining is a value obtained by dividing a surface roughness required to be produced by the laser machining of the workpiece by a moving velocity of the workpiece, and the control circuit is further configured to set a value smaller than twice the time constant of laser machining as a sum of a response time constant of a feedback control system included in the laser diode driving power source and the switching period, when a current flowing through the laser diode is detected and feedback control is performed;

wherein the surface roughness required to be produced by the laser machining of the workpiece is defined as a width from a bottom to a top of a concave portion of a cut produced by the laser machining of the workpiece.

5. A laser machining device comprising the laser diode driving power source according to claim 4.

6. The laser machining device according to claim 5, comprising an input screen on which items for allowing inputs of the surface roughness and the moving velocity are displayed.

7. A laser diode driving power source of a laser machining device that radiates laser light emitted from a laser diode to a workpiece to machine the workpiece, comprising:

a power converter including a switching device, to supply a current to the laser diode; and a control circuit configured to control a switching operation of the switching device, the control circuit being configured to set a switching period of the switching device in the control circuit to a value that is smaller than twice a time constant for laser machining, wherein the time constant for laser machining is a value obtained by dividing a surface roughness required to be produced by the laser machining of the workpiece by a moving velocity of the workpiece;

wherein the surface roughness required to be produced by the laser machining of the workpiece is defined as a width from a bottom to a top of a concave portion of a cut produced by the laser machining of the workpiece.

8. A laser machining device comprising the laser diode driving power source according to claim 7.

9. The laser machining device according to claim 8, comprising an input screen on which items for allowing inputs of the surface roughness and the moving velocity are displayed.

* * * * *